United States Patent
Zeng et al.

(10) Patent No.: US 12,023,729 B2
(45) Date of Patent: Jul. 2, 2024

(54) DIRECTIONAL SOLIDIFICATION METHOD FOR SUPERALLOY SINGLE CRYSTAL BLADE BASED ON SOLID-LIQUID INTERFACE STEADY CONTROL

(71) Applicant: Shanghai Jiao Tong University, Shanghai (CN)

(72) Inventors: Long Zeng, Shanghai (CN); Jun Li, Shanghai (CN); Mingxu Xia, Shanghai (CN); Neng Ren, Shanghai (CN); Binqiang Wang, Shanghai (CN); Jianguo Li, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 176 days.

(21) Appl. No.: 17/773,048

(22) PCT Filed: Jan. 5, 2021

(86) PCT No.: PCT/CN2021/070246
§ 371 (c)(1),
(2) Date: Apr. 29, 2022

(87) PCT Pub. No.: WO2021/196814
PCT Pub. Date: Oct. 7, 2021

(65) Prior Publication Data
US 2022/0395896 A1 Dec. 15, 2022

(30) Foreign Application Priority Data
Apr. 3, 2020 (CN) .......................... 202010260178.5

(51) Int. Cl.
*B22D 27/04* (2006.01)
*C30B 11/00* (2006.01)
*C30B 29/52* (2006.01)

(52) U.S. Cl.
CPC ........... *B22D 27/045* (2013.01); *C30B 11/003* (2013.01); *C30B 11/006* (2013.01); *C30B 29/52* (2013.01)

(58) Field of Classification Search
CPC ..................................................... B22D 27/045
See application file for complete search history.

(56) References Cited

U.S. PATENT DOCUMENTS 6,003,587 A 12/1999 Mitsuhashi

FOREIGN PATENT DOCUMENTS

| CN | 102166643 | 8/2011 |
| CN | 102426622 | 4/2012 |

(Continued)

OTHER PUBLICATIONS

English Machine Translation of CN 102426622 A (Year: 2012).*
(Continued)

*Primary Examiner* — Kevin P Kerns
*Assistant Examiner* — Steven S Ha
(74) *Attorney, Agent, or Firm* — JCIPRNET (57) ABSTRACT

The present invention discloses a directional solidification method for a superalloy single crystal blade based on solid-liquid interface steady control. The method establishes effective criteria for withdrawal speed adjustment, i.e. the related position between a macro solid-liquid interface and a thermal baffle, the range between the dendrite tips at the solid-liquid interface, and the difference between the advance speed of the macro solid-liquid interface and the withdrawal speed. With these criteria, the advance of the solid-liquid interface during directional solidification is simulated and a withdrawal speed curve v(t) for the solid-liquid interface steady advancement was obtained. And then, the single crystal blade was prepared.

9 Claims, 5 Drawing Sheets

(56) References Cited

FOREIGN PATENT DOCUMENTS

| CN | 103019103 | 4/2013 |
| CN | 105436478 | 3/2016 |
| CN | 2016183072 | 10/2016 |
| CN | 111375746 | 7/2020 |

OTHER PUBLICATIONS

"International Search Report (Form PCT/ISA/210) of PCT/CN2021/070246," mailed on Apr. 12, 2021, with English translation thereof, pp. 1-4.

"Written Opinion of the International Searching Authority (Form PCT/ISA/237) of PCT/CN2021/070246," mailed on Apr. 12, 2021, with English translation thereof, pp. 1-4.

* cited by examiner

DIRECTIONAL SOLIDIFICATION METHOD FOR SUPERALLOY SINGLE CRYSTAL BLADE BASED ON SOLID-LIQUID INTERFACE STEADY CONTROL

CROSS-REFERENCE TO RELATED APPLICATION

This application is a 371 of international application of PCT application serial no. PCT/CN2021/070246, filed on Jan. 5, 2021, which claims the priority benefit of China application no. 202010260178.5, filed on Apr. 3, 2020. The entirety of each of the above mentioned patent applications is hereby incorporated by reference herein and made a part of this specification.

FIELD OF TECHNOLOGY

The present invention belongs to the field of superalloy single crystal blade preparation by directional solidification, and particularly relates to a directional solidification method for a superalloy single crystal blade based on solid-liquid interface steady control.

BACKGROUND

Single crystal hollow turbine blade is the hot core component of aero-engines, which is known as the pearl on the crown in the modern industry. The performance of the single crystal hollow turbine blade is an important index to measure the technical level of the engine, which limits the turbine inlet temperature and then affects the thrust-to-weight rate, the combustion efficiency and the service life of the engine. According to the public data, the turbine blade for the foreign advanced aero-engine represented by F119 has a service life of more than 10,000 hours, while the turbine blade for a certain Chinese engine has a service life of less than 4,000 hours with a big gap from the western countries. Therefore, it is essential to improve the preparation technology of the high-performance turbine blade, so as to develop the advanced aero-engine industry in China.

Currently, the single crystal hollow turbine blade is mainly prepared through directional solidification processes, including: high rate solidification (HRS), liquid melt cooling (LMC), and downward directional solidification (DWDS). The HRS directional solidification method featuring the simple apparatus and convenient operation has been widely used in industry since 1960's. During the HRS process, heat is continuously transferred through the bottom of the casting and the lateral portion of the mold when the superalloy melt and the mold are pulled out from the heating furnace together. With the continuous advance of the solid-liquid interface, the cooling rate in the casting and the temperature gradient in front of the solid-liquid interface keep decreasing, the curvature of the solid-liquid interface keeps increasing and the shape keeps becoming complicated. The curvature of the solid-liquid interface changes more complex especially at the place where the areas of the single crystal cross-section changes abruptly and stray grains formed frequently. Therefore, optimizing the shape of solid-liquid interface and improving the steady of the solid-liquid interface are the main methods to reduce the occurrence of stray grains during the single crystal blade preparation process.

Ma et al. from RWTH Aachen University in Germany indicate that the heat dissipation capacity in the blade body is enhanced and the cooling rate in the center of the platform is accelerated by applying a heat conductor in the junction between the blade body and the platform. Therefore, the curvature of the solid-liquid interface is reduced and the stray grains occurred at the edge of platform are effectively eliminated. With the same principle, professor Wu Qiang from Jiangsu University proves that the curvature of the solid-liquid interface could be reduced and the stray grains at the edge of the platform could be effectively eliminated through slowing down the heat dissipation capacity and the related cooling rate at the edge of the platform by applying a ceramic thermal insulation in the mold of this place (CN 102166643 A). However, the heat conductor method and the thermal insulation method have not been promoted in production due to the complexity of mold fabrication and uncontrollable mold quality. Professor Xu Qingyan from Tsinghua University invents a self-adaptive variable withdrawal speed simulation method (CN 201110362376.3). This method uses neural network algorithm and set $\alpha$, $\beta$, and $\gamma$, which are the angles between the minimum calculation unit and X axis, Y axis, and the Z axis respectively, and the temperature gradient G of the solid-liquid two-phase zone as variables. The withdrawal speed is increased when the ratio of the calculation units meeting the acceleration conditions (G<2° C./mm, $\gamma>\alpha$, and $\gamma>\beta$) to the total calculation units in the two-phase zone exceeds 0.059. The withdrawal speed is decreased when the ratio of the calculation units meeting the deceleration conditions (G<2° C./mm, $\gamma>\alpha$, and $\gamma>\beta$) to the total calculation units in the two-phase zone is smaller than 0.785. However, the method is based on mathematical statistics and neglects the geometrical factor of the solid-liquid interface, it can only meet the production requirement of the solid single crystal blade or the hollow single crystal blade with the simple section.

SUMMARY

The objective of the present invention is to solve the problems described above and then provide a directional solidification method for a superalloy single crystal blade based on solid-liquid interface steady control. Through real-time adjustment of a withdraw speed, the method could real-time optimize the advance speed and the shape of a solid-liquid interface, so as to control the width of the solid-liquid zone, reduce the curvature of the solid-liquid interface and eliminate the constitutional supercooling at the front of the solid-liquid interface and the occurrence of stray grains.

The objective of the present invention is realized through the following technical solution:

A directional solidification method for a superalloy single crystal blade based on solid-liquid interface steady control uses directional solidification apparatus for production and includes:

(1) establishing a three-dimensional numerical model for high rate solidification (HRS) directional solidification process;

(2) acquiring, by pre-embedding thermocouples, the actual temperature field variation of a blade, during the directional solidification process;

(3) optimizing, according to the actual temperature field variation of the blade, the three-dimensional numerical model;

(4) establishing an effective withdrawal adjustment criterion for HRS directional solidification;

(5) calculating, based on the three-dimensional numerical model and the withdrawal speed adjustment criterion, a withdrawal speed curve v(t) for solid-liquid interface steady advancement; and (6) preparing, based on the withdrawal speed curve v(t), the single crystal blade.

Further, establishing a three-dimensional numerical model for the HRS directional solidification process in step (1) specifically includes: use FLUENT numerical simulation software and C language compiling environment. Simplify and input the geometry of the directional solidification apparatus, a blade casting, and a mold and mesh them with a built-in module. Then, input the physical parameters of alloy, the mold and materials of different parts of a furnace. Finally, debug and verify the numerical model.

Further, the thermocouples in step (2) are platinum-rhodium thermocouples, embedded at the different height of outside and inside of the mold. The thermocouples are connected with vacuum electrodes of a solidification chamber through the thermocouple compensation wire, and then with a temperature collector. The temperature collection range of the temperature collector is 0-1800° C. and the temperature collection frequency is 10-1000 Hz.

Further, optimizing the three-dimensional numerical model for HRS directional solidification in step (3) specifically includes: Set the related initial condition and boundary condition of the three-dimensional numerical model according to the actual experiment or production parameters. Based on the thermocouples' positions, set the related monitoring points in the three-dimensional numerical model and collect the local temperature. Compare the difference between a simulated value and a measured value, and then adjust thermal resistances between mold and chilling plate, mold and molten alloy, and molten alloy and chilling plate, as well as the surface emissivity of mold surface, heating element, thermal baffle and water-cooling wall, ensuring that the deviation of the simulated temperature curve and the measured temperature curve is less than 5%.

Further, establishing an effective withdrawal speed adjustment criterion for HRS directional solidification in step (4) includes:

criterion 1, the withdrawal speed is increased when the related position between the macro solid-liquid interface and the thermal baffle is higher, and it is decreased when the related position is lower;

criterion 2, the withdrawal speed is increased when the range between the dendrite tips at the solid-liquid interface is greater than the maximum critical value, and it is decreased when the range is smaller than the minimum critical value. The critical value depends on the simulation result, industrial test data, and the critical nucleation undercooling degree of the alloy; and criterion 3, the withdrawal speed is increased when the difference between the advance speed of the macro solid-liquid interface and the withdrawal speed is positive, and it is increased when the difference is negative.

The initial withdrawal speed is empirically established, and the adjustment on the withdrawal speed starts from the end of the spiral grain selector which only involves single crystal growth stage.

Further, calculating a withdrawal speed curve v(t) for solid-liquid interface steady advancement based on the three-dimensional numerical model and the withdrawal speed adjustment criterion in step (5) specifically includes: select time step size and speed adjustment step size, and then sequentially read the related position between the macro solid-liquid interface and the thermal baffle, the range between the dendrite tips at the solid-liquid interface, and the difference between the advance speed of the macro solid-liquid interface and the withdrawal speed during the HRS directional solidification process. And then judge whether the withdrawal speed needs adjustment. If not, execute the next step. If yes, return to the previous step and recalculate the withdrawal speed. When the whole process is calculated, a withdrawal speed curve v(t) with time is obtained.

Further, the adjustment rate is 1 μm/s-10 μm/s, and time step size is 10 s-120 s, which particularly depend on the specific shape of the blade and specific parameters of the apparatus. The obtained curve v(t) is subjected to noise reduction by Gaussian filter.

Further, step (6) particularly includes: input the obtained withdrawal speed curve v(t) into the HRS directional solidification apparatus. Select the related single crystal blade mold and superalloy, and then prepare the single crystal blade.

Further, the directional solidification apparatus is mainly composed of a melting chamber, a directional solidification chamber, a vacuum system, a heating system, a cooling system, and a control system.

The directional solidification chamber is provided with a holding furnace, a chilling plate, and a directional solidification motor. The holding furnace consists of an upper heating zone and a lower heating zone. The furnace heated by medium-frequency induction uses graphite as the heating element and carbon fiber graphite for heat preservation. The chilling plate, which is made of pure copper, owns a cooling channel inside. The directional solidification is driven by a servo motor, with a moving speed of 1 μm/s-1000 μm/s and a minimum adjustment step of 1 μm/s. The directional solidification speed is 20 μm/s-100 μm/s.

Further, the melting temperature of the superalloy is 1450-1600° C. and the casting speed of the superalloy is 3-10° C./s. During the directional solidification process, the heating temperature of the upper heating zone and the lower heating zone are 1500-1600° C. and 1450-1550° C., respectively.

Further, the prepared single crystal blade is subjected to macrostructure detection, particularly including surface sand blasting and macrostructure etching.

The key of the present invention, the directional solidification method for a superalloy single crystal blade based on solid-liquid interface steady control, is to establish a three-dimensional numerical model for the HRS directional solidification process, and use this mode to carry out the numerical simulation of the single crystal blade directional solidification process, so as to obtain the withdrawal speed curve capable of realizing steady advance of the superalloy solid-liquid interface.

The core of the present invention is the criteria for withdrawal speed adjustment, i.e. the related position between the macro solid-liquid interface and the thermal baffle, the range between the dendrite tips at the solid-liquid interface, and the difference between the advance speed of the macro solid-liquid interface and the withdrawal speed. The withdrawal speed is increased when the variables reach the set critical acceleration condition, and it is reduced when the variables reach the set critical deceleration condition. In this way, through repeated iterations, the withdrawal speed is continuously adjusted to make the solid-liquid interface smoothly advance, so as to achieve the purpose of controlling the width of the solid-liquid two-phase region, reducing the curvature of the solid-liquid interface and eliminating the constitutional supercooling at the front of solid-liquid interface and the occurrence of stray grains.

Compared with the prior art, the present invention has the following beneficial effects:

1. The present invention, the variable withdrawal speed directional solidification method based on solid-liquid interface steady advancement, is to eliminate the stray grains in the rabbet and subsequently improve the quality and qualification rate of single crystal preparation by developing or adjusting the withdrawal speed according to the geometric characteristics of sharp change of the cross section along the height direction and the supercooling degree window of stray grain nucleation. In addition, the present invention distributes and adjusts the withdrawal speed more efficiently, so as to greatly improve the production efficiency of the single crystal blade.

2. The present invention gives full play to the advantages of the numerical simulation in intelligent manufacturing. It could formulate the variable speed withdrawal curve, meanwhile monitor and output solidification parameters (such as temperature gradient, cooling rate and et. al) under this process condition in real time, which could evaluate and visualize the solidification process. Instead of searching for the optimized solution by performing a large number of experiments or establishing a database, the present invention could obtain the effective withdrawal curve only through verifying the calculation model based on a group of benchmark experiments as reference, which could greatly reduce the experimental materials and time cost.

3. The present invention has strong universality. Based on numerical simulation technology, it could modify the geometric model and physical parameters according to a furnace type, a blade type and an alloy component, and then output the related variable withdrawal speed curve suitable for this condition. The method could adjust the withdrawal speed based on the physical criteria even adjust the critical point of each criterion according to specific production requirements, which make the implementation of this method more flexible. In addition, the software of this method is based on a C language environment interface, which makes it easier for the customers to continuously update or re-develop this method according to their specific needs.

BRIEF DESCRIPTION OF THE DRAWINGS

in the figure: 1—melting crucible; 2—runner cup; 3—holding furnace; 4—heating element; 5—mold and casting; 6—thermal baffle; and 7—chilling plate and traction mechanism.

in the figure: the positions for temperature measurement: 1—outside of blade root; 2—outside of blade rabbet; 3—outside of blade body; 4—outside of transition section; 5—middle part of grain selector; and 6—inside of blade body.

DESCRIPTION OF THE EMBODIMENTS

The present invention is described in detail below with reference to the accompanying drawings and the specific embodiments.

Embodiment

In the present embodiment, K4169 superalloy is used to prepare a certain type single crystal turbine blade, where the withdrawal speed at starter block and spiral grain selector is set as 42 μm/s.

The present embodiment particularly includes:

1, A three-dimensional model for high rate solidification (HRS) directional solidification process is established:

FLUENT numerical simulation software and C language compiling environment are used to establish the three-dimensional numerical model for HRS directional solidification. Geometry of the directional solidification apparatus, the blade casting, and the mold are properly simplified, input, and then meshed by a built-in module. Then the physical parameters of the alloy, the mold, and materials of different parts of the furnace are input into the software. Finally, the numerical model is debugged and verified.

Figure 1:
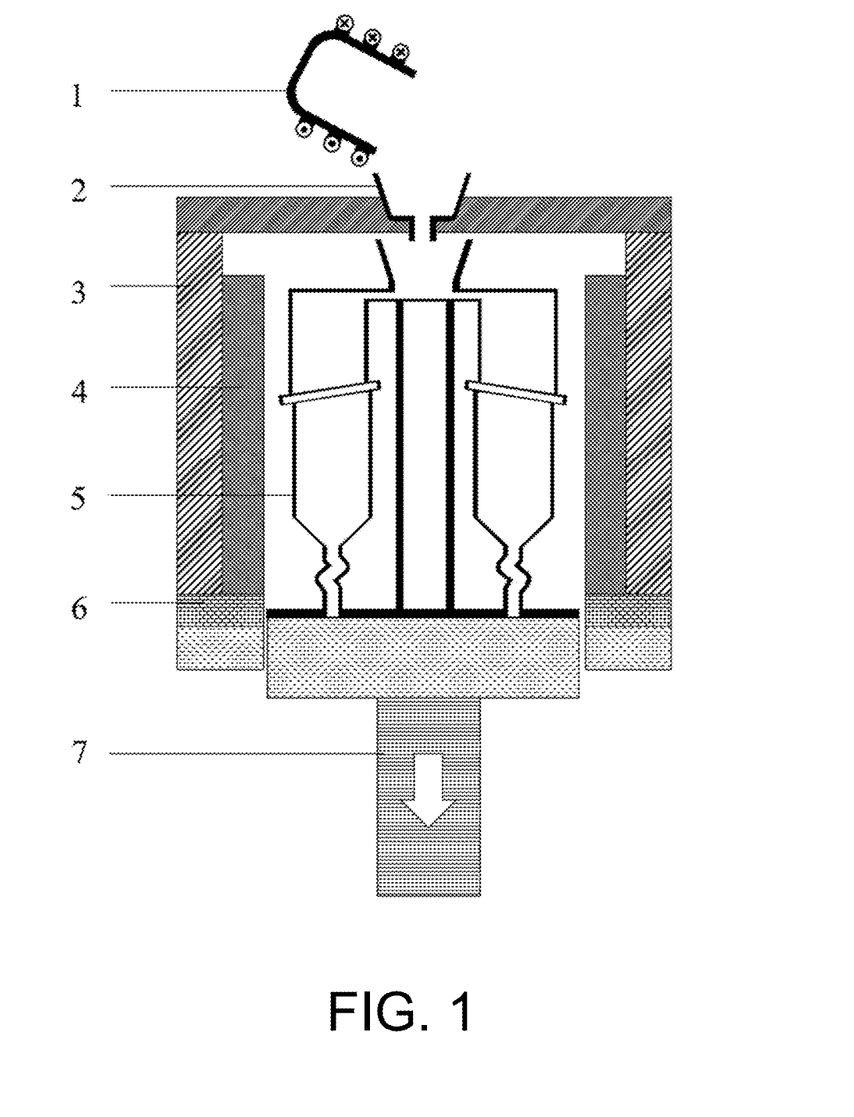
FIG. 1 is a schematic diagram of high rate solidification (HRS) directional solidification apparatus.

The HRS directional solidification apparatus, which is supplied by Ginstrucments Co., Ltd., is typed as GHSF-5 and its schematic diagram is shown in FIG. 1. The HRS directional solidification apparatus includes a melting crucible 1 for alloy melting, a runner cup 2, a holding furnace 3, a heating element 4, a mold and casting 5, a thermal baffle 6, and a chilling plate and related traction mechanism 7.

The directional solidification chamber is provided with a holding furnace, a chilling plate, and a directional solidification motor. The holding furnace consists of an upper heating zone and a lower heating zone. The furnace heated by medium-frequency induction uses graphite as the heating element and carbon fiber for heat reservation. The chilling plate, which is made of pure copper, owns a cooling channel inside. The directional solidification is driven by a servo motor, with a moving speed of 1 μm/s-1000 μm/s, and a minimum adjustment step of 1 μm/s.

The thermophysical parameters of related materials are all selected with reference to relevant manuals.

Figure 2:
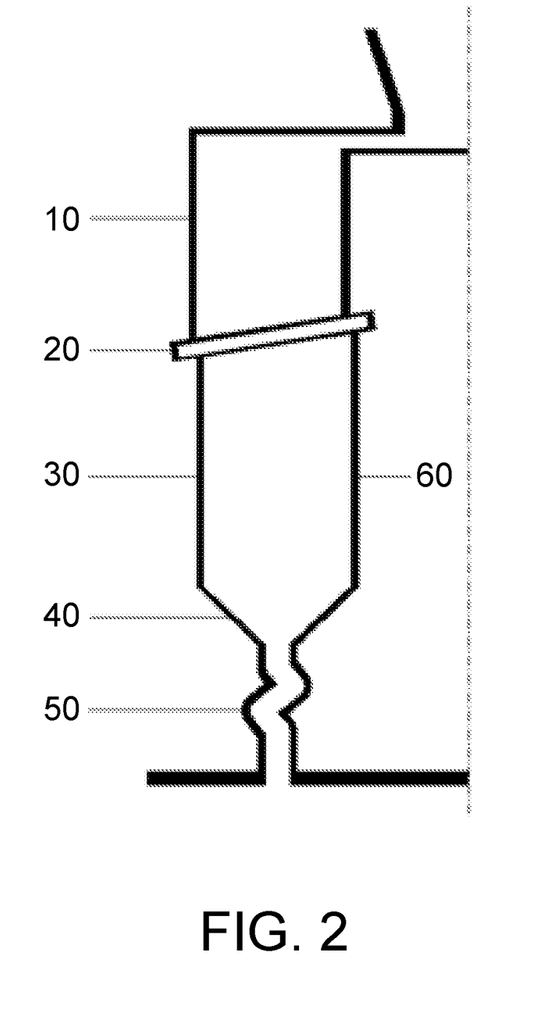
FIG. 2 is a schematic diagram of temperature thermocouples distribution.

2, The temperature field variation, in the directional solidification process, of the blade is acquired by embedding thermocouples:

Take a certain type single crystal blade as the model, prepare the related mold and embed thermocouples in these places as it indicated in FIG. 2, i.e. the outside of the blade root 10, the outside of the blade rabbet 20, the outside of the blade body 30, the outside of the transition section 40, the middle of the grain selector 50, the inside of the blade body 60, et. al. The thermocouple is a B-type platinum-rhodium thermocouple with a temperature measurement range of 0-2000° ° C., which is protected by an $Al_2O_3$ ceramic tube to prevent over-melting during temperature measurement. The thermocouples are connected with vacuum electrodes of a solidification chamber through the thermocouple compensation wire, and then with the temperature collector. The temperature collection range of the temperature collector is 0-2000° C. and the temperature collection frequency is 60 Hz."

K4169 is melted, cast, and directionally solidified, and the temperature field during the directional solidification process is acquired. The melting temperature for superalloy is 1480-1530° C. and the casting speed for the superalloy is 5° C./s. During the directional solidification process, the heating temperatures of the upper heating zone and the lower heating zone are 1430-1470° C. and 1400-1440° C., respectively. The directional solidification speed is 42 μm/s.

3, The three-dimensional numerical model for HRS directional solidification is optimized:

In the newly-established three-dimensional numerical model, the related initial condition and boundary condition are set according to actual experiment or production parameters. The related monitoring point is set according to thermocouples' positions and the local temperature is collected. The difference between the simulated value and the measured value is compared. To ensure the deviation of the simulated temperature curve and the measured temperature curve is less than 5%, the thermal resistances between the mold and a chilling plate, the mold and molten alloy, and the molten alloy and the chilling plate are adjusted, as well as the surface emissivity of a mold surface, the heating element, the thermal baffle and a water-cooling wall.

4, An effective withdrawal speed adjustment criterion for HRS directional solidification is established:

In the present embodiment, three variates are selected, including: the related position between macro solid-liquid interface and thermal baffle, the range between the dendrite tips at the solid-liquid interface, the difference between the advance speed of the macro solid-liquid interface and the withdrawal speed. The related position between the macro solid-liquid interface and the thermal baffle represents the solidification rate of the single crystal blade. The range between the dendrite tips at the solid-liquid interface represents the relative growth rate of dendrites in the directional solidification process of the single crystal blade. The difference between the advance speed of the macro solid-liquid interface and the withdrawal speed represents the lag of the withdrawal speed and the solidification rate at each time step. In view of the above description, the criterion for withdrawal speed adjustment during the single crystal directional solidification process based on solid-liquid interface steady control is determined as follows:

Criterion 1, the withdrawal speed is increased when the related position between the macro solid-liquid interface and the thermal baffle is higher, and it is decreased when the related position is lower.

Criterion 2, the withdrawal speed is increased when the range between the dendrite tips at the solid-liquid interface is greater than the maximum critical value, and it is decreased when the range is smaller than the minimum critical value. The critical value depends on the simulation result, industrial test data, and the critical nucleation undercooling degree of the alloy.

Criterion 3, the withdrawal speed is increased when the difference between the advance speed of the macro solid-liquid interface and the withdrawal speed is positive, and it is increased when the difference is negative.

During the directional solidification method for single crystal blade based on solid-liquid interface steady control, the initial withdrawal speed is empirically established, so as to obtain a desirable grain selection effect.

During the directional solidification method for single crystal blade based on solid-liquid interface steady control, the adjustment on the withdrawal speed starts from the end of the spiral grain selector which only involves a single crystal growth stage.

During the directional solidification method for single crystal blade based on solid-liquid interface steady control, the adjustment rate is 1 μm/s-10 μm/s, and time step size is 10 s-120 s, which particularly depends on the specific shape of the blade and specific parameters of the apparatus.

Figure 3:
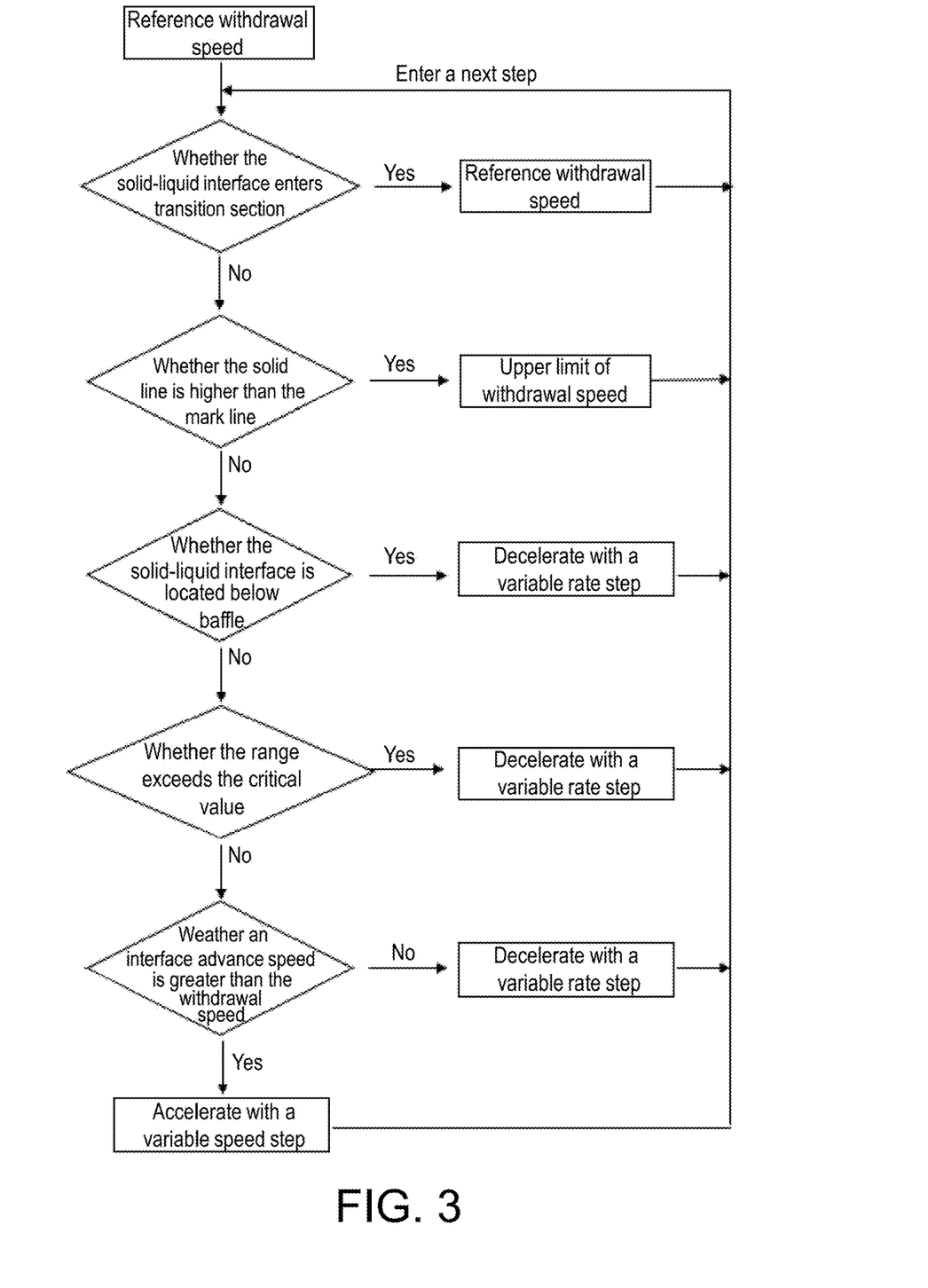
FIG. 3 is a flow chart for withdrawal speed calculation.

The criteria 1-3 form closed loop to control the blade solidification process in HRS directional solidification process in real time, as shown in FIG. 3, particularly.

Figure 4:
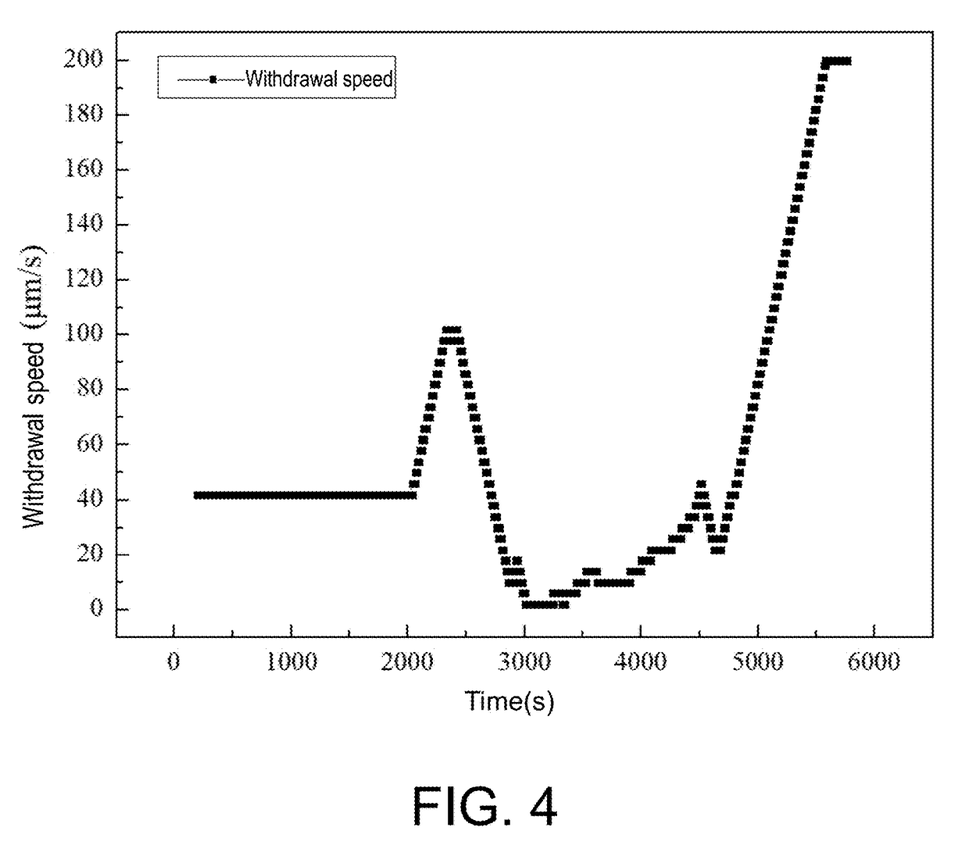
FIG. 4 is a withdrawal speed curve for directional solidification of a certain type single crystal blade.

5, A withdrawal speed curve v(t) for solid-liquid interface steady advancement is calculated based on the three-dimensional numerical model and the withdrawal speed adjustment criterion:

The withdrawal speed adjustment criterion and the method in step 4 are input into the three-dimensional numerical model established in step 3. The time step size and the speed adjustment step size are selected. The related position between the macro solid-liquid interface and the thermal baffle, the range between the dendrite tips at the solid-liquid interface and the critical value, and the difference between the advance speed of the macro solid-liquid interface and the withdrawal speed are sequentially read for each step during the HRS directional solidification process. Then, it is judged whether the withdrawal speed needs adjustment. If not, execute the next step. If yes, return to the previous step and recalculate the withdrawal speed. When the whole process is calculated, a withdrawal speed curve v(t) with time is obtained. FIG. 3 is the working flow chart of numerical simulation calculation of solid-liquid interface steady control. The withdrawal speed curve v(t) with time is obtained after all processes are calculated. Gaussian filter is used to reduce noise on the process curve when the obtained curve v(t) is unsmooth. FIG. 4 is the withdrawal speed curve for directional solidification of a certain type single crystal blade.

6, The calculated withdrawal speed curve v(t) is used to prepare the single crystal blade:

The calculated withdrawal speed curve v(t) is input into the HRS directional solidification apparatus. Then, the related single crystal blade mold and the superalloy are selected to prepare the single crystal blade.

The melting temperature of the superalloy is 1480-1600° C. and the casting speed of the superalloy is 3-10° C./s. During the directional solidification process, the heating temperature of the upper heating zone and the lower heating zone are 1500-1600° C. and 1450-1550° C., respectively.

Finally, macrostructure detection is carried out on the single crystal blade:

The macrostructure detection of the single crystal blade includes surface sand blasting and macrostructure etching. The surface sand blasting time is 5 min. The macrostructure etching is carried out according to GB/T 14999.7-201 for the test of superalloy grain size, and the etchant is hydrochloric acid+hydrogen peroxide (with a volume ratio of 9:1).

Figure 5:
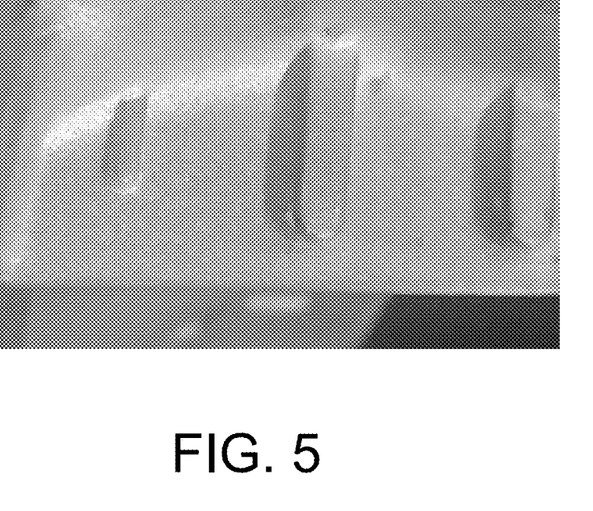
FIG. 5 is a macrostructure of a single crystal blade prepared by a directional solidification method based on solid-liquid interface steady control.
Figure 6:
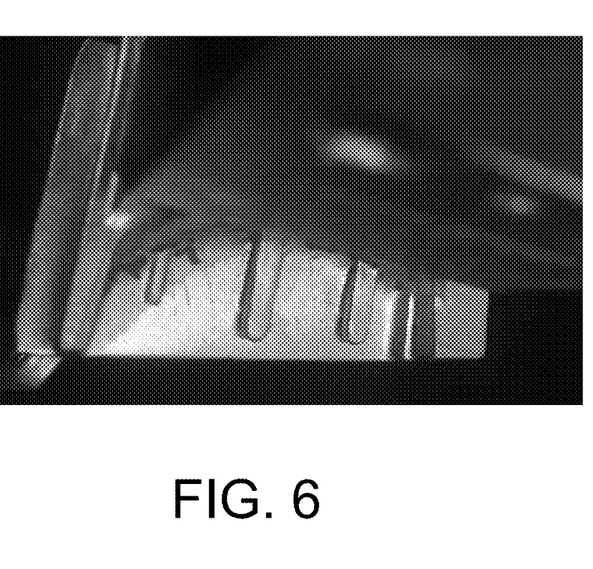
FIG. 6 is a macrostructure of the single crystal blade prepared by a constant withdrawal speed directional solidification method.

FIG. 5 and FIG. 6 are macrostructures at the platform of two single crystal blades prepared through a conventional method and the present invention, respectively. Results show that two of three single crystal blades prepared by the conventional method have stray grains in the platform. While, no stray grains are observed in the single crystal blade prepared by the variable speed drawing process. Therefore, the variable withdrawal speed directional solidification method based on solid-liquid interface control could effectively eliminate the stray grains in the blade rabbet, greatly improve the yield, and significantly optimize the production efficiency of the single crystal blade.

The above description of the embodiment is intended to make it convenient for the ordinary technicians in this field to understand and use the present invention. It will be apparent to those skilled in the art that various modifications may be readily made to these embodiments and the general principles described herein may be applied to other embodiments without making the inventive efforts. Therefore, the present invention is not limited to the embodiments described above, and improvements and modifications made by those skilled in the art in light of the present invention without departing from the scope of the present invention shall all fall within the scope of protection of the present invention.

What is claimed is:

1. A directional solidification method for a superalloy single crystal blade based on solid-liquid interface, comprising following steps:
   step (1) establishing a three-dimensional numerical model for a directional solidification process;
   step (2) acquiring, by pre-embedding thermocouples, an actual temperature field variation of a blade, in the directional solidification process;
   step (3) optimizing, according to the actual temperature field variation of the blade, the three-dimensional numerical model;
   step (4) establishing a withdrawal speed adjustment criterion for the directional solidification process;
   step (5) calculating, based on the three-dimensional numerical model and the withdrawal speed adjustment criterion, a withdrawal speed curve v(t) for solid-liquid interface steady advancement; and
   step (6) preparing, based on the withdrawal speed curve v(t), a single crystal blade,
   wherein establishing the three-dimensional numerical model for the directional solidification process in the step (1) comprises: simplifying and inputting, by using FLUENT numerical simulation software and C language compiling environment, geometric shapes of a directional solidification apparatus, a blade casting, and a mold and meshing them with a built-in module; then, inputting physical parameters of an alloy, the mold and a material of each part of a furnace; and finally, debugging and verifying the three-dimensional numerical model.

2. The directional solidification method for the superalloy single crystal blade based on solid-liquid interface steady control according to claim 1, wherein the thermocouples in the step (2) are platinum-rhodium thermocouples and pre-embedded at different heights of surfaces and inner portions of the mold; the thermocouples are connected with vacuum electrodes of a directional solidification chamber through thermocouple compensation wires, and then are connected with a temperature collector; and a temperature collection range of the temperature collector is 0° ° C. to 1800° C. and a temperature collection frequency is 10 Hz to 1000 Hz.

3. The directional solidification method for the superalloy single crystal blade based on solid-liquid interface according to claim 1, wherein optimizing the three-dimensional numerical model for the directional solidification in the step (3) comprises: setting an initial condition and a boundary condition corresponding to the three-dimensional numerical model according to casting parameters of an experiment or a production; setting monitoring points according to the three-dimensional numerical model and collecting local temperatures according to positions of the thermocouples; and comparing a difference between the simulated value and the measured value, and then adjusting thermal resistances between a mold and a chilling plate, between the mold and a molten alloy, and between the molten alloy and the chilling plate, as well as the emissivity of surfaces of the mold, heating element, thermal baffle and water-cooling wall, such that a deviation of the simulated value and the measured value in a temperature curve can be controlled within 5%.

4. The directional solidification method for the superalloy single crystal blade based on solid-liquid interface according to claim 1, wherein establishing the withdrawal speed adjustment criterion for the directional solidification process in the step (4) comprises following three criterions:
   criterion 1, the withdrawal speed is increased when a relative position between the macro solid-liquid interface and thermal baffle is higher, and the withdrawal speed is decreased when the relative position is lower;
   criterion 2, the withdrawal speed is increased when a range between the dendrite tips at the solid-liquid interface is greater than a maximum critical value, and the withdrawal speed is decreased when the range is smaller than a minimum critical value, the maximum and minimum critical values depending on a simulation result, industrial test data, and a critical nucleation undercooling degree of the alloy; and
   criterion 3, the withdrawal speed is increased when a difference between the advance speed of the macro solid-liquid interface and the withdrawal speed is positive, and the withdrawal speed is increased when the difference is negative,
   wherein an initial withdrawal speed is empirically established, and adjustment on the withdrawal speed starts from an end of the spiral grain selector which only involves a single crystal growth stage.

5. The directional solidification method for the superalloy single crystal blade based on solid-liquid interface according to claim 1, wherein calculating, based on the three-dimensional numerical model and the withdrawal speed adjustment criterion, the withdrawal speed curve v(t) for solid-liquid interface steady advancement in the step (5) comprises: selecting a time step size and a speed adjustment step size; sequentially reading a relative position between the macro solid-liquid interface and thermal baffle, a range between the dendrite tips at the solid-liquid interface and a critical value, and a difference between the advance speed of the macro solid-liquid interface and the withdrawal speed during the directional solidification process; then judging whether the withdrawal speed needs adjustment, if not, executing the next step; if yes, returning to the previous step and recalculating the withdrawal speed; and obtaining the withdrawal speed curve v(t) with time when a whole process is calculated.

6. The directional solidification method for the superalloy single crystal blade based on solid-liquid interface according to claim 5, wherein the speed adjustment step size is 1 μm/s to 10 μm/s, and the time step size is 10 s to 120 s, the speed adjustment step size and the time step size depend on the shape of the blade and parameters of an apparatus; and the obtained withdrawal speed curve v(t) is subjected to noise reduction by Gaussian filter.

7. The directional solidification method for the superalloy single crystal blade based on solid-liquid interface according to claim 1, wherein the step (6) comprises: inputting the obtained withdrawal speed curve v(t) into a directional solidification apparatus; selecting a related single crystal blade mold and a superalloy; and then preparing the single crystal blade.

8. The directional solidification method for the superalloy single crystal blade based on solid-liquid interface according to claim 7, wherein the directional solidification apparatus is mainly composed of a melting chamber, a directional solidification chamber, a vacuum system, a heating system, a cooling system, and a control system;
   the directional solidification chamber is provided with a holding furnace, a chilling plate, and a directional solidification motor; the holding furnace consists of an upper heating zone and a lower heating zone; the furnace heated by induction uses graphite as a heating element and carbon fiber graphite for heat holding; the chilling plate, which is formed by processing a pure copper, has a cooling channel inside; the directional solidification motor is driven by a servo motor, with a moving speed of 1 μm/s to 1000 μm/s and a minimum adjustment step of 1 μm/s; and a directional solidification speed is 20 μm/s to 100 μm/s.

9. The directional solidification method for the superalloy single crystal blade based on solid-liquid interface according to claim 8, wherein a melting temperature of the superalloy is 1450° C. to 1600° C. and a casting speed of the superalloy is 3° C./s to 10° C./s; and during the directional solidification process, heating temperatures of the upper heating zone and the lower heating zone are 1500° C. to 1600° C. and 1450° C. to 1550° C., respectively.

\* \* \* \* \*